US00RE36305E

United States Patent [19]

Dennison

[11] E Patent Number: Re. 36,305

[45] Reissued Date of Patent: Sep. 14, 1999

[54] METHOD FOR FABRICATION OF CLOSE-TOLERANCE LINES AND SHARP EMISSION TIPS ON A SEMICONDUCTOR WAFER

[75] Inventor: Charles H. Dennison, Meridian, Id.

[73] Assignee: Micron Technology, Inc., Boise, Id.

[21] Appl. No.: 08/687,785

[22] Filed: Jul. 19, 1996

Related U.S. Patent Documents

Reissue of:

[64] Patent No.: 5,330,879
Issued: Jul. 19, 1994
Appl. No.: 07/914,804
Filed: Jul. 16, 1992

[51] Int. Cl.[6] ..... G03C 5/00

[52] U.S. Cl. ..... 430/313; 430/314; 430/323; 430/324; 737/228; 737/229; 737/241; 737/243

[58] Field of Search ..... 430/313, 314, 430/323, 324; 437/228, 229, 241, 243, 67

[56] References Cited

U.S. PATENT DOCUMENTS

| | | | |
|---|---|---|---|
| 4,634,645 | 1/1987 | Matsuda et al. | 430/314 |
| 4,671,970 | 6/1987 | Keiser et al. | 430/314 |
| 5,032,491 | 7/1991 | Okumura et al. | 430/314 |

FOREIGN PATENT DOCUMENTS

| | | |
|---|---|---|
| 56-73435 | 6/1981 | Japan . |
| 59-155929 | 9/1984 | Japan . |

OTHER PUBLICATIONS

Van Zant, *Microchip Fabrication—A Practical Guide to Semiconductor Processing*, McGraw–Hill Publishing Company, pp. 88–89, 162–163, 222–223, 308–309, 1990.

*Primary Examiner*—Rachel Gorr
*Attorney, Agent, or Firm*—Trask, Britt & Rossa

[57] ABSTRACT

A method for fabricating submicron lines over a semiconductor material by creating a narrow hard mask over the material using a narrow void-producing process. The narrow void is thus used as a mask to form lines that are narrower than those that can be produced by current lithography techniques. The method can also be used to create sharp emission tips for field effect display devices.

72 Claims, 4 Drawing Sheets

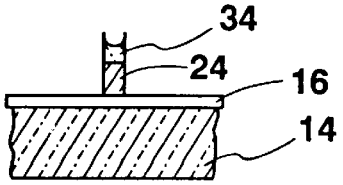
FIG 10
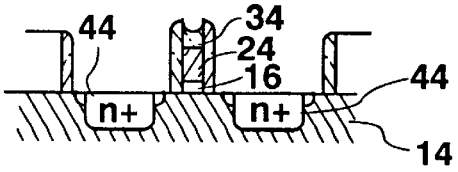
FIG 11
FIG 12
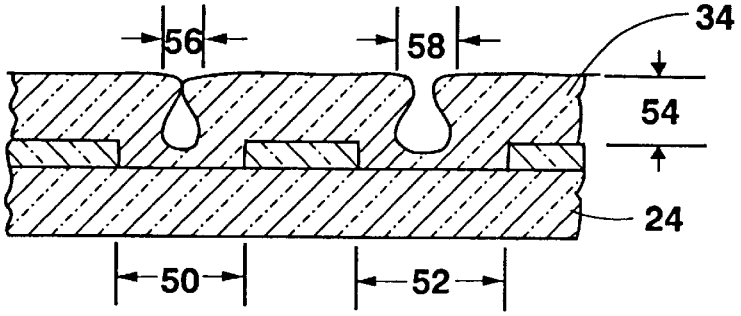
FIG 13
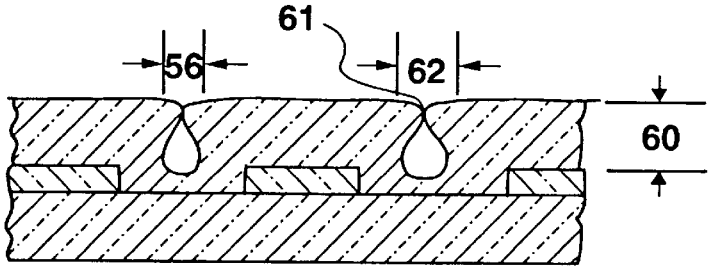
FIG 14
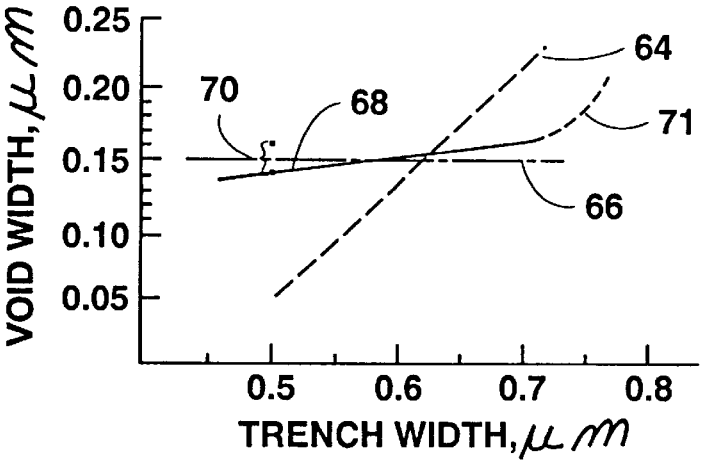

METHOD FOR FABRICATION OF CLOSE-TOLERANCE LINES AND SHARP EMISSION TIPS ON A SEMICONDUCTOR WAFER

Matter enclosed in heavy brackets [ ] appears in the original patent but forms no part of this reissue specification; matter printed in italics indicates the additions made by reissue.

FIELD OF THE INVENTION

The invention relates in general to a method for fabricating submicron lines on wafers and sharp tips for field effect device and, in particular, to the method for forming a close-tolerance line or sharp tip in a semiconductor wafer substrate or layer using a loose tolerance trench, or well.

BACKGROUND OF THE INVENTION

Often times in semiconductor wafer fabrication, it is desirable to fabricate a line having closer tolerances than photolithography or other line-forming methods. These close-tolerance lines are utilized for field effect devices and other integrated circuit devices produced on semiconductor wafers. In the past, it has been necessary to either purchase expensive precision fabrication equipment or relax the tolerances. Accordingly, it would be desirable to have a method for fabricating a close-tolerance line or sharp tip without requiring close-tolerance precise fabrication equipment. One example of use of this line would be for a narrow gate on a MOS FET device.

SUMMARY OF THE INVENTION

The present invention is a novel method for producing close-tolerance sharp tips or narrow lines in a semiconductor wafer substrate or layer where the fabrication equipment, i.e., photolithography apparatus, is only capable of producing a larger, looser tolerance line. The first step of the method is to fabricate a trench in a first layer over the substrate using the looser tolerance photolithography or other fabrication equipment available. The next step is to deposit a non-conformal material over the wider line and substrate, thereby forming a void with a uniform, close-tolerance width regardless of variations in the previously formed trench. Next, a chemical mechanical polish (CMP) process is performed to planarize and expose the close-tolerance width dimension void. An etch-resist conformal material is then deposited over the first layer and in the void. The conformal material is then planarized leaving material only in the void to form a mask of a predetermined close-tolerance width. The walls of the non-conformal material and the first layer are then etched away, leaving a ridge or wall under the mask of the same close-tolerance thickness as the void, disposed above the original wafer substrate in a position where a new line of close tolerance is to be formed at the predetermined desired position along the substrate.

This formed, two-layer ridge or wall then acts as a hard mask for subsequent patterning of the substrate by etching or other fabrication techniques. The ridges or lines formed in this manner can be in the range of 0.1 to 0.15 $\mu$m.

In a second embodiment, the same process can be used to form a sharp, pointed tip such as that desired for high resolution field emission tips used in cold cathode emitters that are utilized in the field emitter display devices. In this case, the tip mask is formed as a cylindrical vertical pillar in lieu of a line or linear trench.

Other objects, advantages, and capabilities of the present invention will become more apparent as the description proceeds.

BRIEF DESCRIPTION OF THE DRAWINGS

FIG. 10 is a partial side section view of an IC semiconductor die of FIG. 9 after a second selective etching;

FIG. 11 is a partial side section view of an IC semiconductor die of the final submicron line;

FIG. 12 is a partial side section view of an IC semiconductor die having a pair of trenches of differing widths filled with a non-conformal layer;

FIG. 13 is the partial side section view of an IC semiconductor die having a pair of trenches of differing widths of FIG. 12 now filled with a non-conformal layer of deeper depth;

FIG. 14 is a graph of void width as a function of trench width;

DETAILED DESCRIPTION OF THE INVENTION

Figure 1:
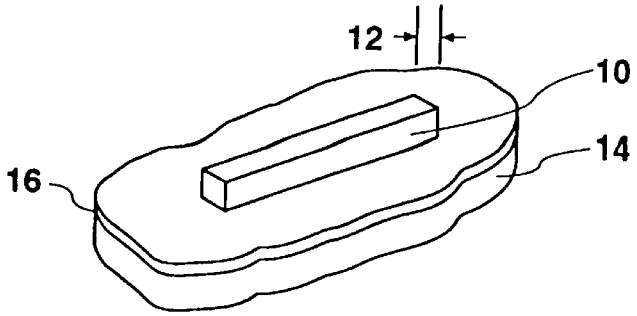
FIG. 1 is a perspective view of a submicron line formed by the present inventive method.

The final submicron line 10 fabricated by this inventive process can be seen in FIG. 1. This line which may be used as a gate in a final integrated circuit (IC) device and can have a width dimension of 0.1 $\mu$m as at 12 which is significantly narrower than the width available by current photolithography methods. The line has been fabricated in substrate 14 and has a gate oxide layer 16 under the line 10.

Figure 2:
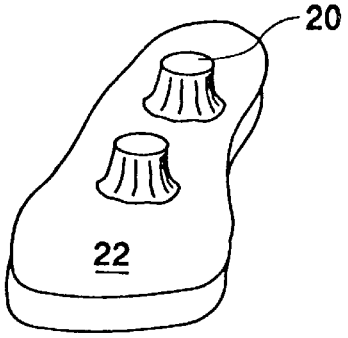
FIG. 2 is a perspective view of a sharp tip formed by the present method.

In a second embodiment, a sharp point 20 may be seen in FIG. 2 fabricated by the same basic process. A sharp point is needed in the fabrication of a field emitter device having a cold cathode (point) 20, a control grid, and an anode (not shown) on a substrate 22. The process for forming the point 20 is similar to the submicron line process except for the shape, i.e., a circular pyramid 20 in lieu of a line 10 (FIG. 1).

Figure 3:
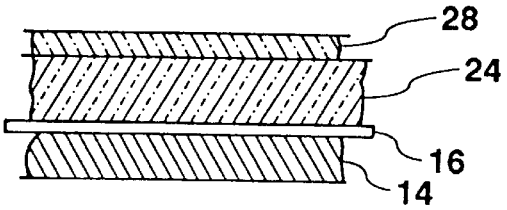
FIG. 3 is a partial side section view of an integrated circuit (IC) semiconductor die.
Figure 4:
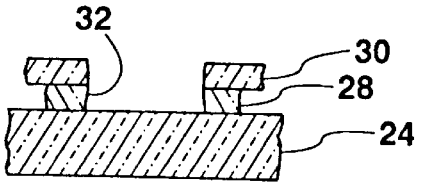
FIG. 4 is a partial side section view of an upper section the IC semiconductor die of FIG. 3 after etching.
Figure 5:
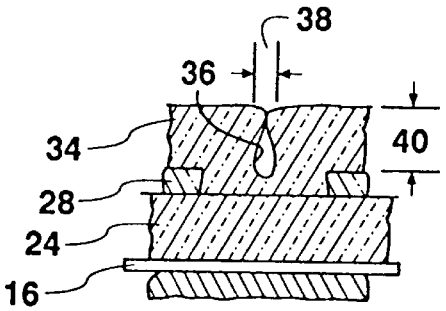
FIG. 5 is a partial side section view of an IC semiconductor die of FIG. 4 after non-conformal layering.

The process for submicron line formation 10 will be described by referring to FIGS. 3–11. FIG. 3 indicates the typical beginning steps in IC semiconductor wafer. The substrate 14 has a typical gate oxide layer 16 formed over substrate 14 and a typical gate polysilicon layer 24 deposited over the oxide 16. A mask oxide layer 28 is deposited over the gate polysilicon layer 24. FIG. 4 shows the results of the photolithography method of forming a trench through a photoresist layer 30 and the mask oxide layer 28 by an etching process. After etching, the photoresist layer 30 is removed by a stripping process. The line or trench 32 is then filled by depositing a non-conformal material 34 as in FIG. 5 which in this inventive process forms a tear-drop shaped void or gap 36 at the center of line 32. A good material for this layer would be plasma silicon oxide ($SiO_2$) or plasma silicon nitride ($Si_3N_4$). Plasma oxide will be used in the described process flow. The depth of layer 34 is controlled and is dependent on the width and depth of line 32. As shown, a typical void width is about 0.1 $\mu$m as at 38 when the depth of the non-conformal layer is 0.45 $\mu$m as at 40.

Figure 6:
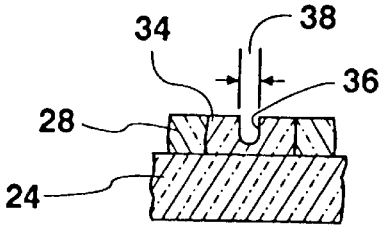
FIG. 6 is a partial side section view of an IC semiconductor die of FIG. 5 after planarizing.

After planarizing the non-conformal material 34 by a chemical mechanical polish, the surface and exposed void 36 appears as in FIG. 6. A key aspect of this invention is the ability to form a void of consistent width 38 without being affected by minor variations in the width of gap 32 which is due to the physical limitations of the photolithography and etch processes.

Figure 7:
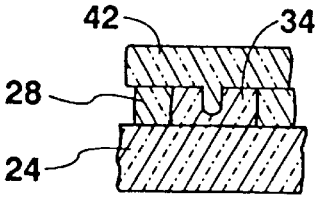
FIG. 7 is a partial side section view of an IC semiconductor die of FIG. 6 after conformal layering.

Referring now to FIG. 7, a conformal mask material 42 is deposited and may consist of any conformal material capable of having a differing plasma etch rate than layer 34. For the process flow shown, polysilicon is deposited by a low pressure chemical vapor deposition (LPCVD) process and is representative of such conformal material.

Figure 8:
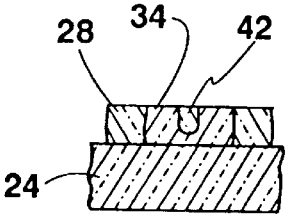
FIG. 8 is a partial side section view of an IC semiconductor die of FIG. 7 after a second planarizing of the conformal layer.
Figure 9:
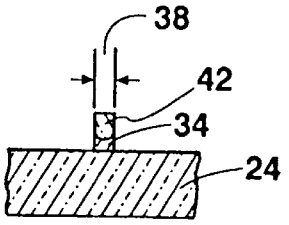
FIG. 9 is a partial side section view of an IC semiconductor die of FIG. 8 after a selective etching.

A second chemical mechanical polishing is performed to remove all the conformal material 42 except that within void 36, as illustrated in FIG. 8. An anisotropic oxide etch simultaneously etches both the plasma oxide 34 and masking oxide 28 down to gate polysilicon layer 24, as in FIG. 9. Next, a plasma polysilicon etch can be done to pattern the underlying oxide 16 and gate polysilicon 24 to form the submicron (0.1 $\mu$m) line as illustrated in FIG. 10. Also, note that the conformal polysilicon layer 42 is simultaneously etched away in this polysilicon etch step. FIG. 11 illustrates the submicron gate material 24 and gate oxide 16 over substrate 14 after typical ion implantation at 44. The remaining steps in the process are dependent on the type of device being fabricated.

Referring now to FIGS. 12 and 13, the capability to form lines of consistent close-tolerance width in spite of variations in trench width 50,52 is demonstrated. Trench lines 50 and 52 have a typical width dimension of 0.4 $\mu$m and 0.6 $\mu$m, respectively, and the deposition of non-conformal layer 34 to a depth of about 0.3 $\mu$m is shown at 54. Void width at 56 is shown about 0.1 $\mu$m while void 58 at this point is about 0.2 $\mu$m. FIG. 13 shows the effect of continuing the deposition of layer 34 to about 0.45 $\mu$m as at 60. This deposition to a depth of 0.45 $\mu$m at 60 has resulted in closing the void at the top section 61 and narrowing the void at 58 to a new void width of 0.1 $\mu$m at 62, thereby matching the void width 56.

The graph of FIG. 14 is used to illustrate the variation of void width as a function of trench width. Using a conformal material would result in linear relationship at 64. The ideal response would be a flat line as at 66, and a desired response or relationship is shown at 68 which indicates about a 0.02 $\mu$m change in void width for a 0.2 $\mu$m change in trench width as at 70. For trench widths over 0.7 $\mu$m, the line 68 would curve upward so as to be parallel to line 64 as at 71 (FIG. 14).

Figure 15:
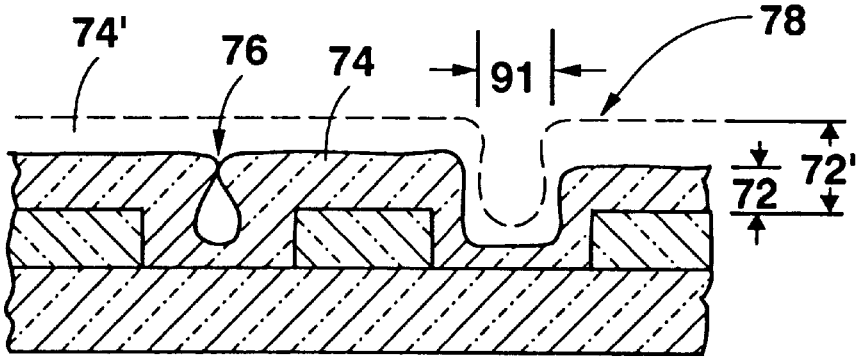
FIG. 15 is a partial side section view of an IC semiconductor die having a non-conformal layer over different width trenches.
Figure 16:
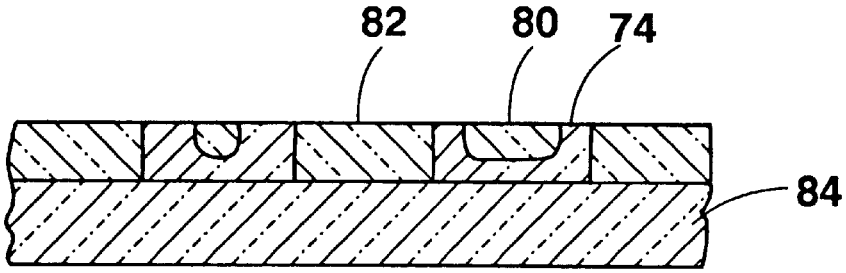
FIG. 16 is a partial side section view of an IC semiconductor die having a non-conformal layer over different width trenches after planarization.
Figure 17:
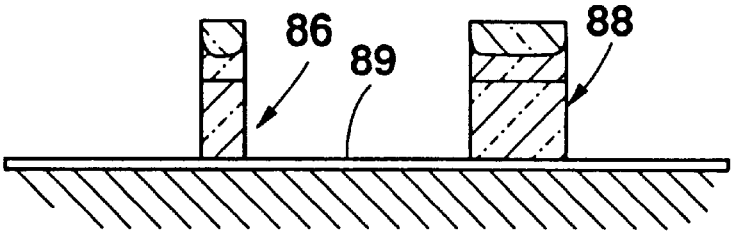
FIG. 17 is a partial side section view of an IC semiconductor die having different width lines.

Referring to FIGS. 15–17, it is also demonstrated that it is also possible to purposely fabricate wide lines and narrow lines simultaneously by controlling the non-conformal layer depth 72. In this instance, the non-conformal layer 74 is above two significantly different width trenches 76 and 78. When these trenches have the conformal mask material 80 deposited and then planarized down to the polysilicon layer 82, the cross-section appears as at FIG. 16. A final gate material 84 cross-section shown in FIG. 17 would have a narrow gate line 86 and wider gate line 88 after etching down to gate oxide 89. It is noted that for the wider trench widths, the final mask width can be controlled by careful control of the non-conformal mask material depths as at 72' (FIG. 15), i.e., the deeper the mask depth deposited, the narrower the final gap as at 91 (FIG. 15).

Figure 18:
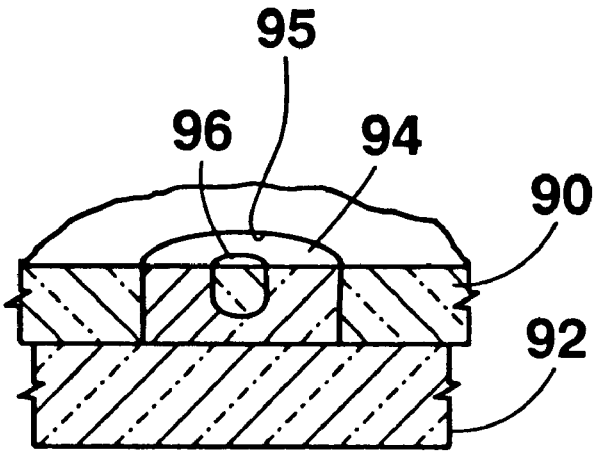
FIG. 18 is a partial section perspective view of a sharp point "mask" process.
Figure 19:
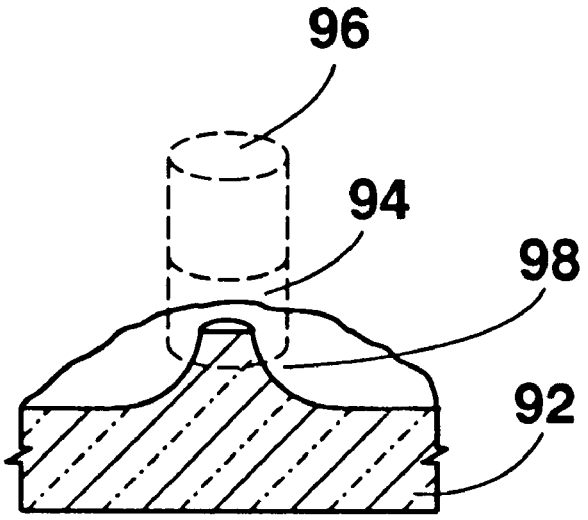
FIG. 19 is a partial section perspective view of a completed sharp point.

The cross-section perspective view of FIG. 18 discloses the fabrication process to make a sharp point for a cold cathode or similar device as shown in FIG. 19. In this case, we have polysilicon layer 90 over the substrate 92 and a non-conformal circular plug 94 in a well 95 in lieu of a trench or line (FIGS. 6–8) and the hard mask TEOS 96 or other material sets within well 95 surrounded by the plug 94. Isotropic etching of the substrate 92 and mask and plug removal would expose the cone-shaped sharp point as at 98 (FIG. 19) of a very small diameter, on the order of 0.1 micron. A cylindrical pillar could also be formed by use of an anisotropic etch process.

It is also possible to fabricate circular gates and anodes surrounding the sharp tip 98 by a similar process.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method for fabricating close-tolerance submicron lines on a semiconductor wafer having a gate oxide layer over a substrate and a gate polysilicon layer over the gate oxide, comprising the steps of:

a. depositing a first layer on top of the gate polysilicon layer;

b. forming a loose-tolerance trench in the first layer having a width of less than 1 micrometer ($\mu$m);

c. depositing a non-conformal material to a predetermined thickness of between 0.3 and 0.45 $\mu$m over the first layer thereby forming a teardrop-shaped void in the trench, said teardrop-shaped void having a narrow, close-tolerance uniform width dimension;

d. chemically, mechanically polishing (CMP) the non-conformal material down to a top surface of the first layer, thereby exposing the void;

e. depositing a conformal mask material over the first layer and void;

f. CMP polishing and removing the conformal mask material down to the first layer, thereby leaving only the narrow void filled with conformal mask material;

g. anisotropically etching by a photolithography process, the first layer and non-conformal material thereby forming the submicron line below the conformal mask material.

2. The method of claim 1 wherein the loose-tolerance trench is between 0.40 $\mu$m and 0.7 $\mu$m.

3. The method of claim 1 wherein the first layer is a mask oxide.

4. The method of claim 1 wherein the non-conformal material is selected from the group consisting of silicon oxide and silicon nitride.

5. The method of claim 1 wherein the conformal mask material is polysilicon.

6. The method of claim 2 wherein the width of the submicron line is less than 0.15 μm.

7. A method for fabricating close-tolerance, sharp emission tip on a semiconductor wafer having a gate oxide layer over a substrate and a gate polysilicon layer over the gate oxide, comprising the steps of:

a. depositing a first layer on top of the gate polysilicon layer;

b. forming a loose-tolerance trench in the first layer having a diameter of less than 1 micrometer (μm);

c. depositing a non-conformal material to a predetermined thickness of between 0.3 and 0.45 μm over the first layer thereby forming a teardrop-shaped void in the trench, said teardrop-shaped void having a narrow, close-tolerance, uniform diameter;

d. chemically, mechanically polishing (CMP) the non-conformal material down to a top surface of the first layer, thereby exposing the void;

e. depositing a conformal mask material over the first layer and void;

f. CMP polishing and removing the conformal mask material down to the first layer, thereby leaving only the void filled with conformal mask material;

g. isotropically etching by a photolithography process the first layer and non-conformal material thereby forming the sharp emission tip below the conformal mask material having a lesser diameter than the loose-tolerance well.

8. The method of claim 7 wherein the loose-tolerance well is between 0.40 μm and 0.7 μm diameter.

9. The method of claim 7 wherein the first layer is a mask oxide.

10. The method of claim 7 wherein the non-conformal material is selected from the group consisting of silicon oxide and silicon nitride.

11. The method of claim 7 wherein the conformal mask material is polysilicon.

12. The method of claim 8 wherein the diameter of the sharp emission tip is less than 0.15 μm.

13. A method for fabricating close-tolerance mask on a semiconductor wafer having a gate oxide layer over a substrate and a gate polysilicon layer over the gate oxide, comprising the steps of:

a. depositing a first layer on top of the gate polysilicon layer;

b. forming a loose-tolerance trench in the first layer having a width of less than 1 micrometer (μm);

c. depositing a non-conformal material to a predetermined thickness of between 0.3 and 0.45 μm over the first layer thereby forming a teardrop-shaped void in the trench, said teardrop-shaped void having a narrow, close-tolerance uniform width dimension;

d. chemically, mechanically polishing (CMP) the non-conformal material down to a top surface of the first layer, thereby exposing the void;

e. depositing a conformal mask material over the first layer and void; and then f. CMP polishing and removing the conformal mask material down to the first layer, thereby leaving only the narrow void filled with conformal mask material.

14. The method of claim 13 wherein the loose-tolerance trench is between 0.40 μm and 0.7 μm.

15. The method of claim 13 wherein the first layer is a mask oxide.

16. The method of claim 13 wherein the non-conformal material is selected from the group consisting of silicon oxide and silicon nitride.

17. The method of claim 13 wherein the conformal mask material is polysilicon.

18. The method of claim 14 wherein the width of the mask is less than 0.15 μm.

19. A method for fabricating close-tolerance, circular mask on a semiconductor wafer having a gate oxide layer over a substrate and a gate polysilicon layer over the gate oxide, comprising the steps of:

a. depositing a first layer on top of the gate polysilicon layer;

b. forming a loose-tolerance well in the first layer having a width of less than 1 micrometer (μm);

c. depositing a non-conformal material to a predetermined thickness of between 0.3 and 0.45 μm over the first layer thereby forming a teardrop-shaped void in the well, said teardrop-shaped void having a narrow, close-tolerance, uniform diameter;

d. chemically, mechanically polishing (CMP) the non-conformal material down to a top surface of the first layer, thereby exposing the void;

e. depositing a conformal mask material over the first layer and void; and then f. CMP polishing and removing the conformal mask material down to the first layer, thereby leaving only the void filled with conformal mask material.

20. The method of claim 19 wherein the loose-tolerance well is between 0.40 μm and 0.7 μm diameter.

21. The method of claim 19 wherein the first layer is a mask oxide.

22. The method of claim 19 wherein the non-conformal material is selected from the group consisting of silicon oxide and silicon nitride.

23. The method of claim 19 wherein the conformal mask material is polysilicon.

*24. A method for fabricating at least one submicron line on a semiconductor substrate having an oxide layer over the semiconductor substrate and a polysilicon layer over the oxide layer, comprising:*

*depositing a first layer on top of the polysilicon layer;*

*forming a trench in the first layer;*

*depositing a non-conformal material over the first layer to form a void in the trench;*

*removing the non-conformal material down to a top surface of the first layer to expose the void;*

*depositing a conformal mask material over the first layer and void;*

*removing the conformal mask material above the first layer; and*

*etching the first layer and non-conformal material.*

*25. The method of claim 24 wherein the trench includes a width of less than 1 μm.*

*26. The method of claim 24 wherein the trench is between 0.40 μm and 0.7 μm in width.*

*27. The method of claim 24 wherein the first layer is a mask oxide.*

*28. The method of claim 24 wherein the non-conformal material is selected from the group consisting of silicon oxide and silicon nitride.*

*29. The method of claim 24 wherein depositing the non-conformal material includes deposition to a thickness of between 0.3 and 0.45 μm.*

*30. The method of claim 24 wherein the conformal mask material is polysilicon.*

*31. The method of claim 24 wherein the submicron line is less than 0.15 μm in width.*

*32. The method of claim 24 wherein the void includes a tear-drop shaped cross section.*

*33. The method of claim 24 wherein removing the non-conformal mask material down to the top surface of the first layer includes chemical mechanical polishing.*

*34. The method of claim 24 wherein removing the conformal mask material above the first layer includes chemical mechanical polishing.*

*35. The method of claim 24 wherein etching the first layer and non-conformal material includes an anisotropic etch.*

*36. A method for fabricating at least one sharp emission tip on a semiconductor substrate having an oxide layer over the semiconductor substrate and a polysilicon layer over the oxide layer, comprising:*

*depositing a first layer on top of the polysilicon layer;*

*forming a well in the first layer;*

*depositing a non-conformal material over the first layer to form a void in the well;*

*removing the non-conformal material down to a top surface of the first layer to expose the void;*

*depositing a conformal mask material over the first layer and void;*

*removing the conformal mask material above the first layer; and*

*etching the first layer and non-conformal material.*

*37. The method of claim 36 wherein the well includes a diameter of less than 1 μm.*

*38. The method of claim 36 wherein the well is between 0.40 μm and 0.7 μm in diameter.*

*39. The method of claim 36 wherein the first layer is a mask oxide.*

*40. The method of claim 36 wherein the non-conformal material is selected from the group consisting of silicon oxide and silicon nitride.*

*41. The method of claim 36 wherein depositing the non-conformal material includes deposition to a thickness of between 0.3 and 0.45 μm.*

*42. The method of claim 36 wherein the conformal mask material is polysilicon.*

*43. The method of claim 36 wherein the sharp emission tip is less than 0.15 μm in diameter.*

*44. The method of claim 36 wherein the void includes a tear-drop shape.*

*45. The method of claim 36 wherein removing the non-conformal mask material down to a top surface of the first layer includes chemical mechanical polishing.*

*46. The method of claim 36 wherein removing the conformal mask material above the first layer includes chemical mechanical polishing.*

*47. The method of claim 36 wherein etching the first layer and non-conformal material includes an anisotropic etch.*

*48. The method of claim 36 wherein etching the first layer and non-conformal material includes an isotropic etch.*

*49. A method for fabricating a mask on a semiconductor substrate having an oxide layer over the semiconductor substrate and a polysilicon layer over the oxide layer, comprising:*

*depositing a first layer on top on the polysilicon layer;*

*forming an opening in the first layer;*

*depositing a non-conformal material over the first layer to form a void in the opening;*

*removing the non-conformal material down to a top surface of the first layer to expose the void;*

*depositing a conformal mask material over the first layer and void; and*

*removing the conformal mask material above the first layer.*

*50. The method of claim 49 wherein the first layer is a mask oxide.*

*51. The method of claim 49 wherein the non-conformal material is selected from the group consisting of silicon oxide and silicon nitride.*

*52. The method of claim 49 wherein depositing the non-conformal material includes deposition to a thickness of between 0.3 and 0.45 μm.*

*53. The method of claim 49 wherein the conformal mask material is polysilicon.*

*54. The method of claim 49 wherein the opening includes a trench.*

*55. The method of claim 54 wherein the trench is less than 1 μm in width.*

*56. The method of claim 54 wherein the trench is between 0.40 μm and 0.7 μm in width.*

*57. The method of claim 54 wherein the mask is less than 0.15 μm in width.*

*58. The method of claim 49 wherein the opening includes a well.*

*59. The method of claim 58 wherein the well is less than 1 μm in diameter.*

*60. The method of claim 58 wherein the well is between 0.40 μm and 0.7 μm in diameter.*

*61. The method of claim 58 wherein the mask is less than 0.15 μm in diameter.*

*62. The method of claim 49 wherein removing the non-conformal mask material down to the top surface of the first layer includes chemical mechanical polishing.*

*63. The method of claim 49 wherein removing the conformal mask material above the first layer includes chemical mechanical polishing.*

*64. A method for fabricating a submicron structure on a semiconductor substrate having an oxide layer over the semiconductor substrate and a polysilicon layer over the oxide layer, comprising:*

*depositing a first layer on top of the polysilicon layer;*

*forming an opening in the first layer;*

*depositing a non-conformal material over the first layer to form a void in the trench;*

*removing the non-conformal material down to a top surface of the first layer to expose the void;*

*depositing a conformal mask material over the first layer and void;*

*removing the conformal mask material above the first layer; and*

*etching the first layer and non-conformal material.*

*65. The method of claim 64 wherein the first layer is a mask oxide.*

*66. The method of claim 64 wherein the non-conformal material is selected from the group consisting of silicon oxide and silicon nitride.*

*67. The method of claim 64 wherein depositing the non-conformal material includes deposition to a thickness of between 0.3 and 0.45 μm.*

*68. The method of claim 64 wherein the conformal mask material is polysilicon.*

*69. The method of claim 64 wherein removing the non-conformal mask material down to the top surface of the first layer includes chemical mechanical polishing.*

*70. The method of claim 64 wherein removing the conformal mask material above the first layer includes chemical mechanical polishing.*

*71. The method of claim 64 wherein etching the first layer and non-conformal material includes an anisotropic etch.*

*72. The method of claim 64 wherein etching the first layer and non-conformal material includes an isotropic etch.*

* * * * *